US007633017B2

(12) United States Patent
Young et al.

(10) Patent No.: US 7,633,017 B2
(45) Date of Patent: Dec. 15, 2009

(54) INTEGRATED JUNCTION BOX OPERABLE WITH GAS VALVE

(75) Inventors: Gregory W. Young, Richfield, MN (US); Peter E. Stolt, Plymouth, MN (US); James I. Bartels, Hudson, WI (US)

(73) Assignee: Honeywell International Inc., Morristown, NJ (US)

( * ) Notice: Subject to any disclaimer, the term of this patent is extended or adjusted under 35 U.S.C. 154(b) by 320 days.

(21) Appl. No.: 11/880,929

(22) Filed: Jul. 25, 2007

(65) Prior Publication Data

US 2009/0025975 A1 Jan. 29, 2009

(51) Int. Cl.
*H05K 5/00* (2006.01)

(52) U.S. Cl. ......................... 174/520; 174/50; 700/284; 239/69

(58) Field of Classification Search .................. 174/50, 174/520, 17 R, 58, 60; 700/282-284; 239/63, 239/69-70; 439/535; 220/4.02, 3.8; 248/906
See application file for complete search history.

(56) References Cited

U.S. PATENT DOCUMENTS 3,417,212 A * 12/1968 Driscoll ................... 200/43.08
3,915,185 A * 10/1975 Sanner ...................... 137/78.3
6,757,589 B1 6/2004 Parker et al.
6,775,593 B1 8/2004 Parker et al.
6,990,393 B2 * 1/2006 Parker ........................ 700/282
7,189,921 B2 * 3/2007 Andresen et al. .............. 174/50
7,227,079 B2 * 6/2007 Noest et al. ................... 174/50
7,268,294 B2 * 9/2007 Ohkawa et al. ............... 174/53

* cited by examiner

*Primary Examiner*—Dhiru R Patel

(57) ABSTRACT

A junction box is operable with a gas valve and includes an enclosure having one or more mechanical coupling features arranged to interface with one or more mating features of the gas valve. An electrical terminal strip is disposed within the enclosure and a quick-disconnect electrical connector is disposed on a surface of the enclosure. The quick-disconnect electrical connector is coupled to a mating connector of the gas valve when the mechanical coupling features are interfaced with the mating features of the gas valve. The junction box includes a current carrying element that electrically couples the electrical terminal strip with the quick-disconnect electrical connector. The enclosure includes an opening that facilitates access to at least the electrical terminal strip, and includes one or more access voids disposed to allow electrical wires to enter the enclosure.

20 Claims, 4 Drawing Sheets

INTEGRATED JUNCTION BOX OPERABLE WITH GAS VALVE

FIELD OF THE INVENTION

This invention relates in general to industrial controls, and in particular to commercial burner/boiler gas valves.

BACKGROUND

Industrial heating, ventilation and air-conditioning (HVAC) systems often rely on gas powered combustion to produce heat. This typically involves combusting natural gas in a burner or boiler to heat a gas or liquid. The heated gas or liquid may be used in an HVAC system, such as by directly heating air that is forced through ducts, or heating water which circulates through radiators. Boilers and burners may be used for other purposes as well, such as providing hot water for washing, providing heat for manufacturing processes, co-generation of electricity, etc.

One key component on many industrial boilers and burners is a gas valve. A simple system may use a gas valve connected with one or more thermostats. The gas valve shuts on and off in response to the boiler temperature satisfying certain limits. More sophisticated systems may rely on a number of sensors and microprocessor controllers. These control components can provide enhanced safety, better control of system outputs, increase energy efficiency, and improve other aspects of system operation.

When installing a gas valve, a technician may need to run wires, plumbing lines up to a valve, and install other structural components separate from valves and other control devices. This often involves setting up junction boxes and other peripheral structures between components. Conduits are fabricated and connected between the junction boxes and components, and wires are run through the conduits and terminated at the component devices. Finally the circuits are assembled inside the junction boxes via terminal blocks or other field serviceable connectors. This assembly of peripheral items such as conduit and junction boxes can be time consuming, and in some installations may require a significant amount of space. Therefore, a way to simplify boiler/burner installations is desirable.

SUMMARY

The present disclosure relates to gas valve installations, in particular to electronically controlled gas valves suitable for industrial burner/boiler installations. In one embodiment of the invention, a junction box that is operable with a gas valve includes an enclosure having one or more mechanical coupling features arranged to interface with one or more mechanical mating features of the gas valve. An electrical terminal strip is disposed within the enclosure and a quick-disconnect electrical connector is disposed on a surface of the enclosure. The quick-disconnect electrical connector is disposed so as to couple to a mating electrical connector of the gas valve when the mechanical coupling features are interfaced with the mechanical mating features of the gas valve. The box includes a current carrying element that electrically couples the electrical terminal strip with the quick-disconnect electrical connector. The enclosure includes an opening that facilitates access to at least the electrical terminal strip, and the enclosure includes one or more access voids disposed to allow electrical wires to enter the enclosure.

In more particular embodiments, the quick-disconnect electrical connector includes one or more conductors that slideably interface with one or more mating conductors of the mating electrical connector. In such a case, the one or more conductors may be perpendicularly disposed relative to the surface of the enclosure. In another configuration, the electrical terminal strip includes a plurality of screw terminals.

In other arrangements, the junction box further includes one or more conduit fittings disposed proximate to the one or more access voids. The current carrying element may include a circuit board, and the circuit board comprises electronic circuitry configured to operate with the gas valve. In another arrangement, the terminal strip includes one or more spare terminals that are electrically separate from the quick-disconnect electrical connector. In one configuration, the one or more mechanical coupling features of the junction box and the one or more mechanical mating features of the gas valve comprise a tool-less mechanical connection.

In another embodiment of the invention, a method of coupling a junction box to a gas valve involves coupling a quick disconnect electrical connector disposed on an external face of the junction box with a connector on a surface of the gas valve. The junction box is mechanically coupled to the gas valve, and one or more wires are introduced through an opening of the junction box. The one or more wires are coupled to a electrical terminal strip disposed within the junction box. The electrical terminal strip is electrically connected to the quick disconnect electrical connector of the junction box, and coupling the one or more wires causes the gas valve to be coupled to a control system.

In more particular embodiments, the method further involves introducing a second set of wires into the opening of the junction box such that the second set of wires are part of a circuit that is isolated from the gas valve, and the second set of wires are coupled via spare terminals of the electrical terminal strip. The spare terminals are electrically separate from the quick-disconnect electrical connector. In one implementation, mechanically coupling the junction box to the gas valve involves coupling the junction box to the gas valve via a tool-less mechanical connector. The method may also involve, before coupling the quick-disconnect connector with the connector on the surface of the gas valve, removing a wire harness from the connector on the surface of the gas valve. In such a case, coupling the one or more wires to the electrical terminal strip involves forming a wiring circuit that replaces the wiring harness.

In another embodiment of the invention, a gas valve assembly includes a gas valve having an externally mounted first quick-disconnect electrical connector and a first mechanical coupling feature. The assembly also includes a junction box having an enclosure with a second mechanical coupling feature arranged to attach to the first mechanical coupling feature of the gas valve. The junction box includes a second quick-disconnect electrical connector disposed on an external surface of the enclosure so that the second quick-disconnect electrical connector is coupled to the first quick-disconnect electrical connector when the first and second coupling features are attached. An electrical terminal strip is disposed within the enclosure, and a the junction box also includes a current carrying element that electrically couples the electrical terminal strip with the electrical connector. The enclosure includes an opening that facilitates access to at least the electrical terminal strip, and the enclosure includes one or more voids disposed to allow electrical wires to enter the enclosure.

In more particular embodiments, the electrical terminal strip includes a plurality of screw terminals. The gas valve assembly may further include one or more conduit fittings disposed on the one more access voids. In one arrangement, the current carrying element includes a circuit board and the circuit board may include electronic circuitry configured to operate with the gas valve. In another arrangement, the terminal strip includes one or more spare terminals that are electrically separate from the gas valve quick-disconnect electrical connector. In another configuration, the one or more mechanical coupling features of the gas valve assembly and the one or more mating features of the gas valve include a tool-less mechanical connection.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described representative examples of systems, apparatuses, and methods in accordance with the invention.

BRIEF DESCRIPTION OF THE DRAWINGS

The invention is described in connection with the embodiments illustrated in the following diagrams.

DETAILED DESCRIPTION

In the following description of various exemplary embodiments, reference is made to the accompanying drawings that form a part hereof, and in which is shown by way of illustration various embodiments in which the invention may be practiced. It is to be understood that other embodiments may be utilized, as structural and operational changes may be made without departing from the scope of the present invention.

Generally, the present invention is directed to a junction box that may be integrated with an industrial gas valve. The junction box mates with an existing connector on the valve (e.g., a quick disconnect connector) that may be adapted for use with a pre-manufactured cable. The junction box also physically attaches to the valve, and encloses a field serviceable electrical junction such as a terminal strip. In this way, the junction box can take the place of an external junction box that is usually specially installed for such a purpose. The integrated junction box simplifies installation of a gas valve into a system, and may reduce installation errors caused by mis-wiring.

The present invention is directed to gas valves that control the flow of gases, including combustible gases such as natural gas and propane. However, the concepts described herein may be applicable to other fluid control devices, including air valves, water valves, etc. Generally, any electromechanical control device that has an externally accessible, tool-less and/or quick-disconnect type electrical connector that will be joined into circuits with other components in a field installation can benefit from a junction box according to embodiments of the invention.

Figure 1:
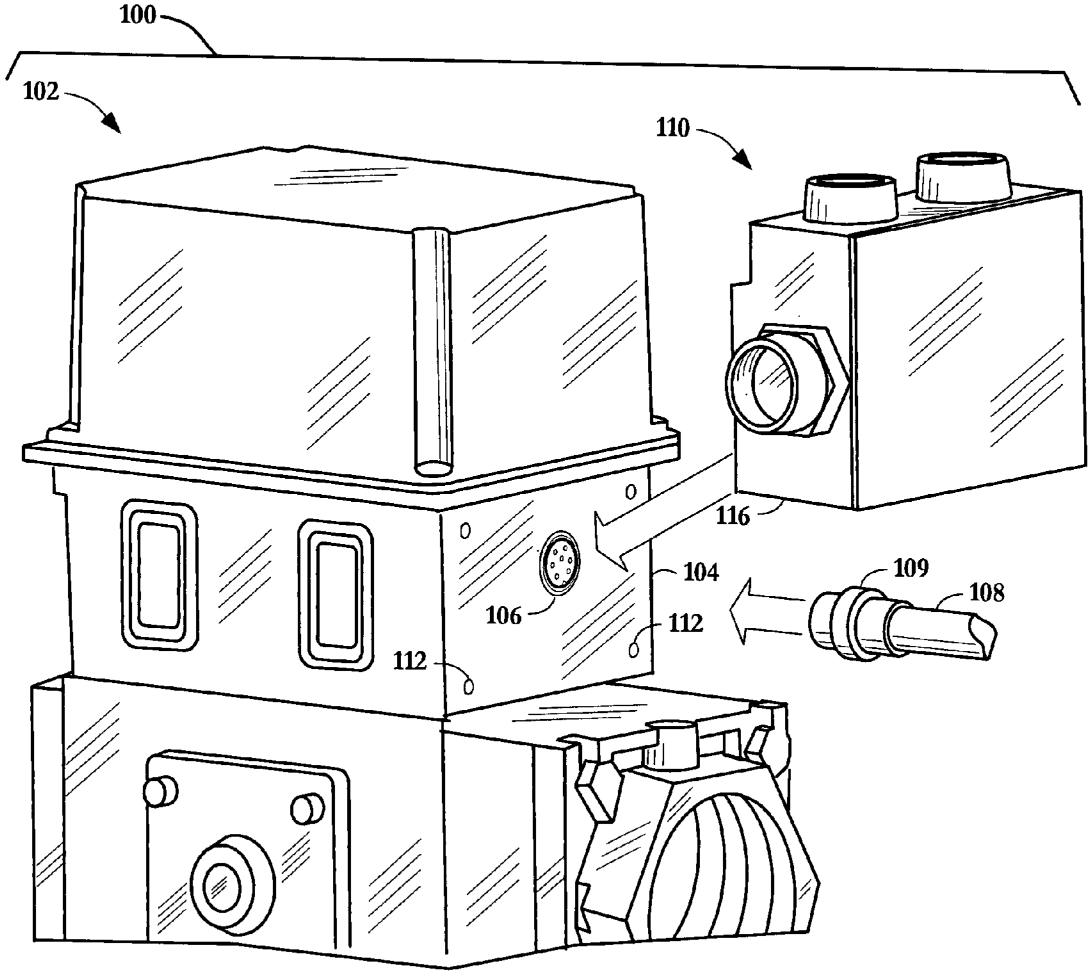
FIG. 1 is a top right exploded perspective view of a valve assembly according to an embodiment of the invention.

In reference now to FIG. 1, a perspective view illustrates a gas valve assembly 100 according to embodiments of the invention. A gas valve 102 includes an electrical controller 104. The controller 104 provides electromechanical control of the functions of the valve 102, and may provide other functions such as sensing. The controller 104 generally includes a connector 106 for interfacing external components of a system with internal circuitry of the controller 104.

In typical installations, the installer may purchase or fabricate a cable 108 that has a connector 109 for interfacing with the connector 106 of the valve controller 104. The installer must typically run the other end of the cable 108 to an external junction box (not shown) in order to complete circuits to which the valve 102 is connected. Typically, the wires of the cable 108 are separated and stripped, then field installable terminal ends (e.g., spade lugs) may be installed on the wires. The terminal ends are connected to a field serviceable connector (e.g., a screw-type terminal strip) to form a circuit with other components and the controller 104.

The valve controller 104 could be connected to any number of other components, including thermostats, thermocouples, relays, microprocessor based system controllers, bus interfaces, etc. Typically, the installer will follow a circuit diagram when connecting components together at the junction box, and may be guided by wire color coding, wire markings, or other indicia. The installer routes and cuts the wire to length, and installs individual wires in a terminal strip or other connector per the circuit diagram.

This manual method of installing wiring can be made more reliable by the use of color coding and wire marking, however the possibility of human error still exists. If the installation environment were well known, a prefabricated cable could be made that couples all of these components (e.g., similar to an automotive or aircraft cable). However, each building installations is usually unique, and therefore it is difficult to predict the physical layout and other factors (e.g., electrical noise, temperatures, fluid exposure) that might affect cable routing.

Because there is unpredictability in a field environment, typical field installations will need a junction box or other enclosure to electrically connect together various components of a system, including the valve 102. The complexity and potential for error in such an installation can be reduced by using an integrated junction box 110 according to embodiments of the invention. The junction box 110 includes electrical connection features (not shown) that directly interface with the controller connector 106. Further, the junction box 110 may have mechanical coupling features that allow the box 110 to interface with mechanical coupling features of the valve 102. In the illustrated example, the valve controller 104 includes mounting holes 112 that may be used to directly attach the box 110 to the valve 102. The mounting holes 112 may be threaded to accept bolts or other types of tool-installed fasteners (e.g., quarter turn fasteners).

Other mechanical coupling features used to join the box 110 and valve 102 may include tool-less devices such as clamps, thumbscrews, latches, snaps, hook-and-loop materials, wire-ties, etc. In some arrangements, the valve connector 106 may include mechanical coupling features that are strong enough to support coupling the entire junction box 110 to the connector 106. As such, the connector 106 (and connector on the box 110 that interfaces with connector 106) form both the electrical and mechanical coupling between the box 110 and valve 102.

Figure 2:
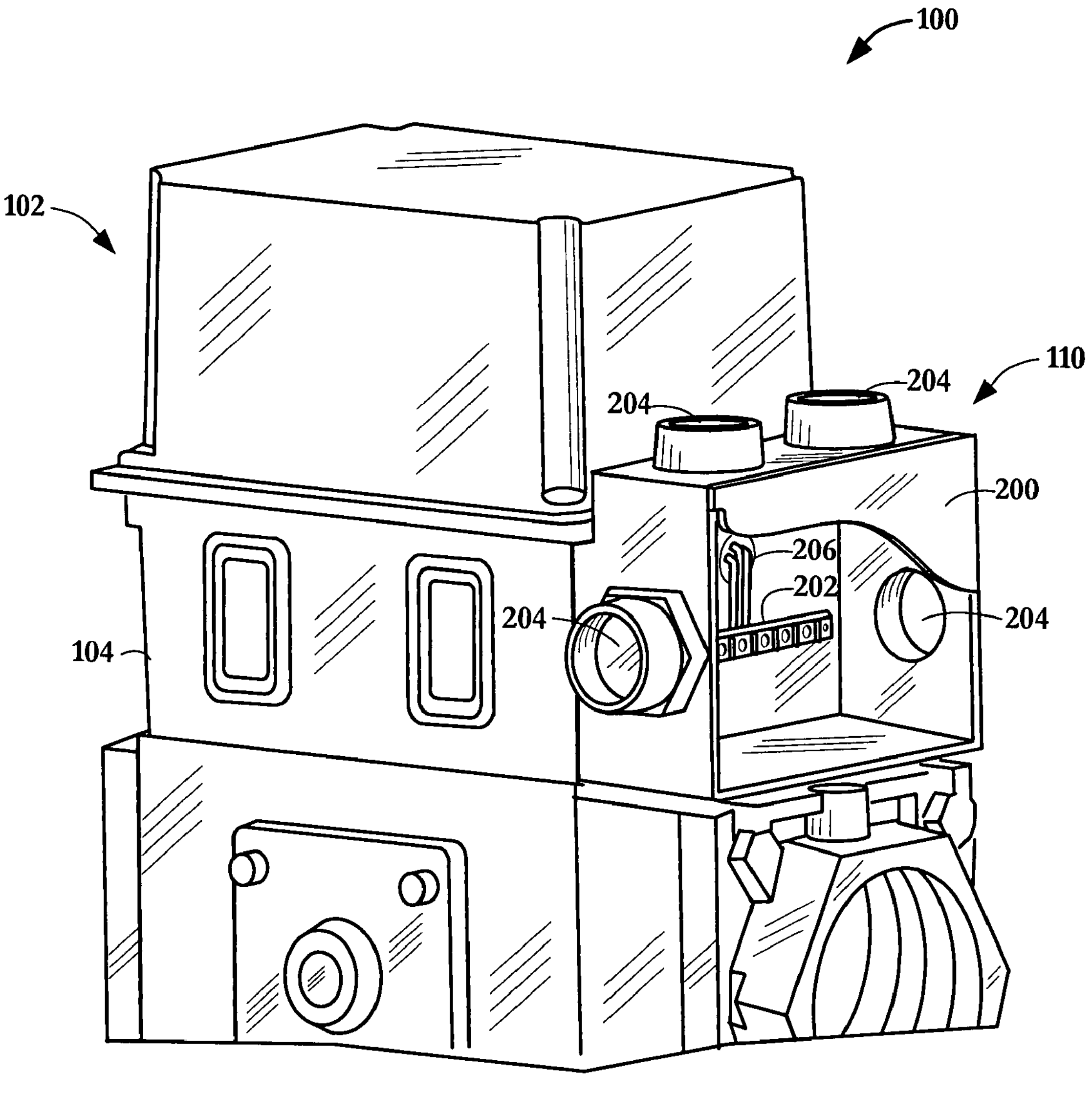
FIG. 2 is a top right perspective view of an assembled valve assembly according to an embodiment of the invention.

The assembled junction box 110 and valve 102 can be seen in the perspective view the gas valve assembly 100 in FIG. 2. The junction box 110 includes a cover 200, which is here shown cut away to reveal internal features of the junction box enclosure 110. As will be described further hereinbelow, the junction box 110 may include a terminal strip 202 or other field serviceable junction. The junction box 110 also includes at least one access hole 204 that facilitates running wires into the box 110. The access hole(s) 204 may include conduit mounting flanges or other features to facilitate attaching wire-carrying conduits to the box 110.

When installing the valve 102 as part of a system, the installer may attach the box 110 as shown to the valve 102, and the terminal strip 202 will be automatically connected to the valve's electrical components, such as via preinstalled conductors 206. Thereafter, the installer may remove the cover 200, introduce wires through the access holes 204, and couple the wires to the terminal strip 202. This procedure removes at least one source of installer error, that of connecting the valve 102 to the terminal strip 202. Further, the box 110 may be of sufficient size to interconnect all of the components of the installation, including those components that are electrically isolated from the valve 102. In that case, the installer can run wires and/or conduits from some or all of the other components to the box 110. This saves the effort of having to run wires and/or conduits from the valve 102 to an external box in order to connect the valve 102 to the control circuit.

Figure 3A:
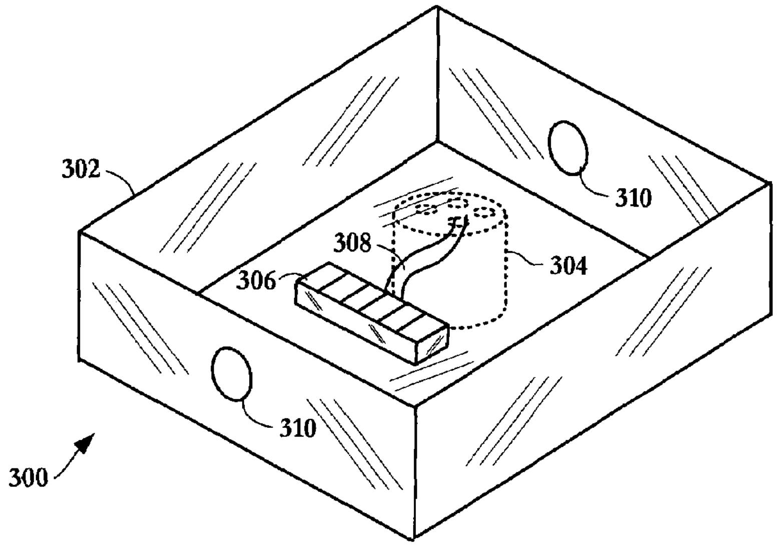
FIG. 3A is a bottom right perspective view of a junction box according to an embodiment of the invention.

In reference now to FIG. 3A, a perspective view illustrates additional features of a junction box 300 according to an embodiment of the invention. The junction box 300 includes an enclosure 302, a coaxial-type quick disconnect plug 304 and a terminal strip 306 that is electrically coupled to the plug 304. In this example, wires 308 connect the terminal strip 306 to the plug 304. Alternate connection members may be used instead of or in addition to the wires 308, such as printed circuit boards, bus bars, direct solder/friction coupling, etc. The terminal strip 306 may include any type of field serviceable coupling device capable of attaching bare wires or wires with terminated ends. Such a terminal strip 306 may include conductive couplers that use any combination of screws, push-receivers, snap-together features, spring clips, or any other electro-mechanical coupling means known in the art.

The enclosure 302 may be a standard plastic or metallic box suitable for particular types of installations. The enclosure 302 typically includes a cover (see cover 322 in FIGS. 3B and 3C), and such cover may be hinged for easy access, and/or fixed with fasteners. The enclosure 302 includes holes/knockouts 310 that facilitates running of wires into the enclosure 302. The holes/knockouts 310 may include features (e.g., threads, flanges) that facilitate attaching conduit to the enclosure 302.

As indicated by the use of hidden lines in FIG. 3A, the connector/plug 304 is located on the outer surface of the enclosure 302 facing away from this view, typically a surface that directly mates with a valve in an installation. In reference now to FIG. 3B, a cutaway side view shows the box 300 attached to a valve 312. Plug 304 can be seen protruding from the back surface 313 of the enclosure 302. The plug 304 attaches to plug 314 of the valve 312. Typically, these plugs 304, 314 slideably interface so that the plugs 304, 314 make an electrical connection when the enclosure 302 is fastened to the body of the valve 312. Other type of connections can be formed between the plugs 304, 314, such as connections formed by spring-loaded pings that directly contact at the face of the pins. The valve connector 314 may be a commonly available commercial type connector (e.g., DIN-standard, D-connector) that facilitates fabricating inexpensive yet reliable cable assemblies. Generally, it is desirable to implement the design of the junction box 300 so that no changes to existing valve designs are needed. For example, the junction box 300 should be compatible with a valve that uses an external cable for connections so that the box 300 and cable can be interchanged with minimal effort.

One advantage of using the integrated junction box 300 is that the terminal block 306 and valve connector 304 can be pre-connected at the factory, thereby minimizing the chance for mis-wiring between these components. In FIG. 3A, wiring 308 was shown connecting these components 304, 306, and in FIG. 3B, a circuit board 316 is shown performing a similar function. A circuit board 316 may have some advantages over the use of wires 308, such as being amenable to mass production (e.g., wave soldering). The circuit board 316 may also be able to include additional circuitry 324 that may be custom adapted for use with the valve 312, such as indicator LEDs, signal conditioning circuits, off-valve sensors, memory storage (e.g., for storing on-valve or off-valve sensor data for historical or forensic purposes), usage metering, safety shut-off, leak detection, smoke detection, and other valve related circuits known in the art.

Figure 3B:
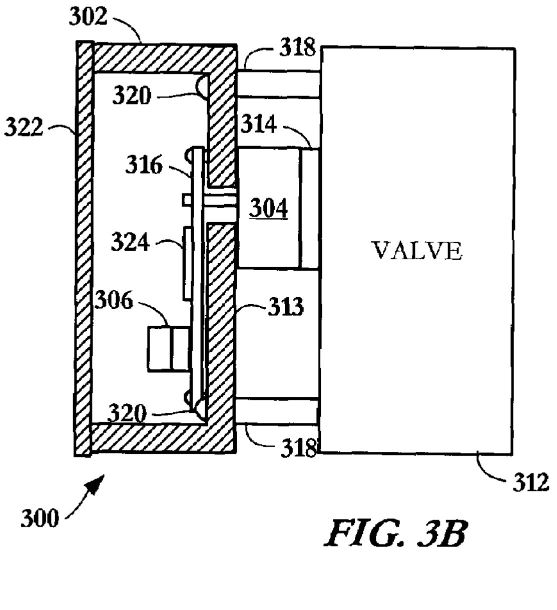
FIG. 3B is a side cutaway view of a junction box and gas valve assembly according to an embodiment of the invention.

In many situations, the valve 312 may include features that allow the box enclosure 302 to be directly physically coupled to the valve 312. In the example of FIG. 3B, standoffs 318 may be part of the valve 312 and/or enclosure 302, and provide a physical attachment of the enclosure 302 with the valve 312, such as by the use of fasteners 320. Generally the fasteners 320 are field replaceable (e.g., screws) although in some cases the installer may choose to provide a more permanent type of attachment (e.g., rivets, welds). The fasteners 320 may require tools to install and/or remove, or may be tool-less.

Generally, the enclosure 302 will include a field accessible cover 322 that protects internal components (e.g., incoming/outgoing wires, terminal 306, circuit board 316, etc.), but allows maintainers access to those components. The enclosure 302 and cover 322 may be made to comply with any NEMA or IEC enclosure standards by including the appropriate gasketing (e.g., water tight NEMA 4, dust tight NEMA 12, etc.) and forming the enclosure 302 from approved materials. The enclosure may be made compliant with any or all standards/requirements to which the valve 312 may be subject.

Figure 3C:
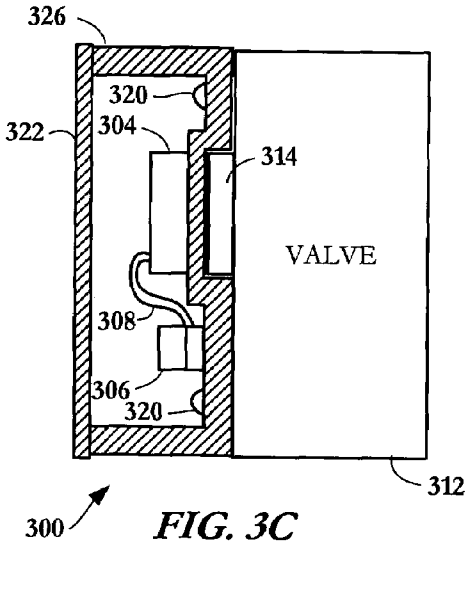
FIG. 3C is a side cutaway view of a junction box and gas valve assembly having an alternate mechanical interface according to an embodiment of the invention.

In FIG. 3C, an embodiment of the junction box 300 is shown with an alternate case 326. This case 326 includes a contoured back surface 326 that conforms to the mounting surface of the valve 312. Therefore this case 326 does not need standoffs or other adapters, and may be directly fastened to the valve 312 by fasteners 320 or by other means. For example, some valve designs may not have any convenient mounting points (e.g., threaded holes, studs) for physically attaching the junction box 300 to the valve 312 via a surface between the two components 300, 312. In those cases, some other feature of the valve 312 and/or box 300 may be used to couple the components, such as by using clamps, snaps, adhesives, and other fastening methods known in the art.

It should be noted that the configurations of the valve 312 and box 300 illustrated in FIGS. 3A-C are provided for purposes of illustration, and many alternate configurations are possible. For example, the valve connector 314 may be recessed or flush with the valve's surface, thereby allowing a flat surface of the box 300 (e.g., surface 313 in FIG. 3B) to rest directly against the valve 312. In other arrangements, the valve 312 may include connections that may not be considered a typical quick disconnect type of connector (e.g., terminal studs, terminal strips). In such a case, the connector 304 could use features such as spring loaded pins that allow the box 304 to be connected to the valve 312 in a quick disconnect fashion.

It will be appreciated that, space permitting, the terminal strip 304 and other components in the enclosure 302, 326 may be used to couple circuitry that is unrelated to the valve 312. For example the valve 312 may be in a convenient location for providing power to other system components, even if the valve itself does not use the power. In that case, spare connections on the terminal 306 (or other features, such as circuit board 316 or a spare terminal strip) could be used as power distribution points for other system components.

Figure 4:
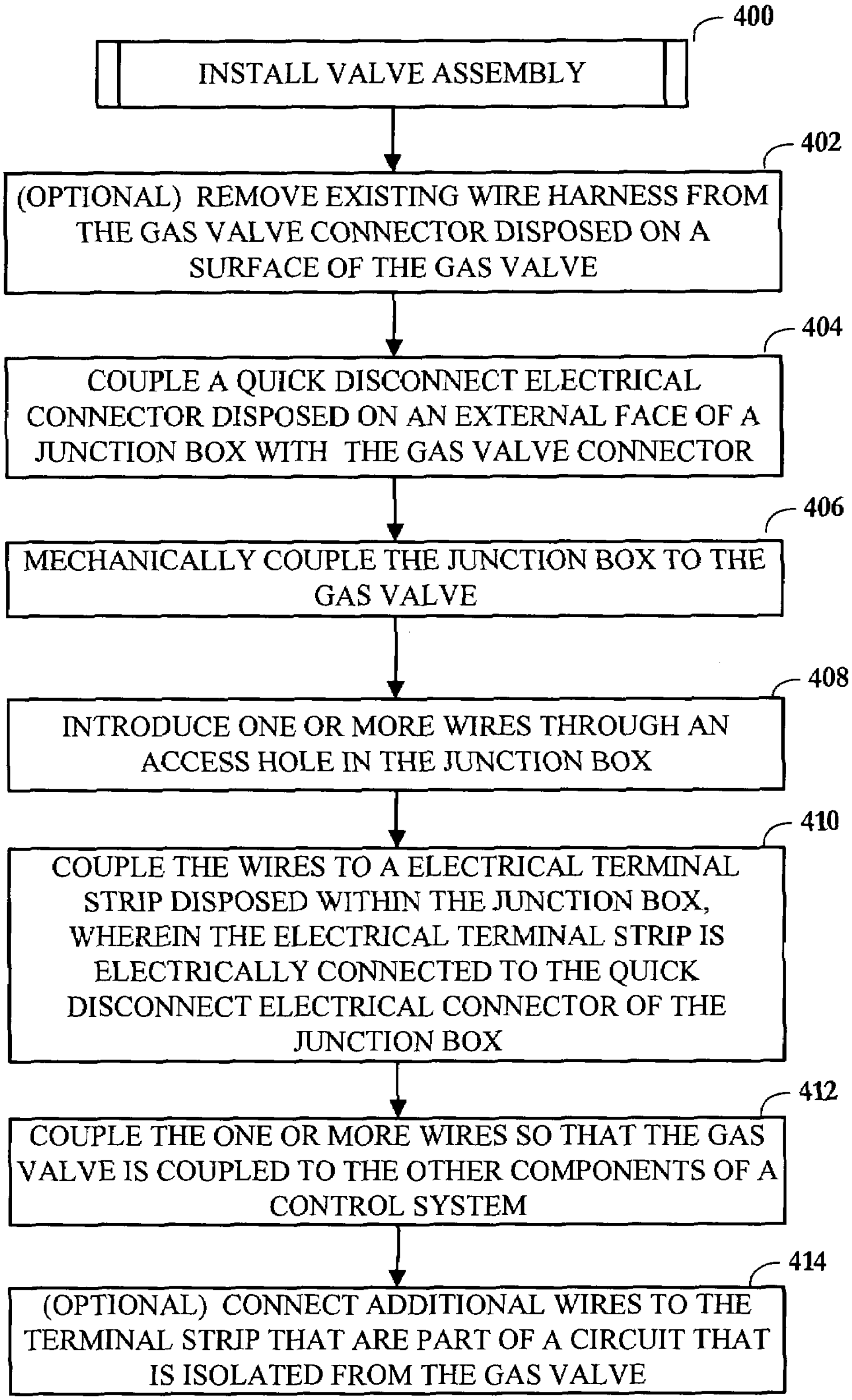
FIG. 4 is a flowchart illustrating a procedure according to an embodiment of the invention.

A junction box according to embodiments of the invention may be used in any type of application, including new installations, retrofits, and/or as part of periodic maintenance. In reference now to FIG. 4, a flowchart illustrates a valve assembly installation procedure 400 according to an embodiment of the invention. In a retrofit or maintenance situation, an existing wire harness may need to be removed 402 from the valve. A quick disconnect electrical connector disposed on an external face of the junction box can then be coupled 404 with a connector on a surface of the gas valve;

The junction box is mechanically coupled 406 to the gas valve, such as by using mechanical fasteners. One or more wires are introduced 408 through an opening of the junction box. The wires are coupled 410 to a electrical terminal strip disposed within the junction box. The electrical terminal strip is electrically connected to the quick disconnect electrical connector of the junction box. The wires are further coupled 412 so that the gas valve to be coupled to a control system. If needed, additional wires that are not part of the gas valve circuit may be connected 414 via the terminal strip.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather determined by the claims appended hereto.

What is claimed is:

1. A junction box operable with a gas valve, comprising:

an enclosure having one or more mechanical coupling features arranged to interface with one or more mechanical mating features of the gas valve;

an electrical terminal strip disposed within the enclosure;

a quick-disconnect electrical connector disposed on a surface of the enclosure so that the quick-disconnect electrical connector is electrically coupled to a mating electrical connector of the gas valve when the mechanical coupling features are interfaced with the mechanical mating features of the gas valve; and a current carrying element that electrically couples the electrical terminal strip with the quick-disconnect electrical connector, wherein the enclosure includes an opening that facilitates access to at least the electrical terminal strip, and wherein the enclosure includes one or more access voids disposed to allow electrical wires to enter the enclosure, wherein the one or more mechanical mating features of the gas valve comprise at least one of a mounting hole, the mating electrical connector, and some other feature of the gas valve, and wherein the one or more mechanical coupling features of the enclosure comprise at least one of a mechanical fastener interface, the quick-disconnect electrical connector attachable with the mating electrical connector of the gas valve, and a mechanical coupler attachable with the some other feature of the gas valve to physically attach the enclosure to the gas valve.

2. The junction box of claim 1, wherein the quick-disconnect electrical connector includes one or more conductors that slideably interface with one or more mating conductors of the mating electrical connector.

3. The junction box of claim 2, wherein the one or more conductors are perpendicularly disposed relative to the surface of the enclosure.

4. The junction box of claim 1, wherein the electrical terminal strip comprises a plurality of screw terminals.

5. The junction box of claim 1, further comprising one or more conduit fittings disposed proximate to the one or more access voids.

6. The junction box of claim 1, wherein the current carrying element comprises a circuit board.

7. The junction box of claim 6, wherein the circuit board comprises electronic circuitry configured to operate with the gas valve.

8. The junction box of claim 1, wherein the terminal strip includes one or more spare terminals that are electrically separate from the quick-disconnect electrical connector.

9. The junction box of claim 1, wherein the one or more mechanical coupling features of the junction box and the one or more mechanical mating features of the gas valve comprise a tool-less mechanical connection.

10. A method of coupling a junction box to a gas valve comprising:

electrically coupling a quick disconnect electrical connector disposed on an external face of the junction box with a connector on a surface of the gas valve;

mechanically coupling the junction box to the gas valve using at least one of a mechanical fastener attachable to a mounting hole of the gas valve, of the junction box that is attachable with the connector of the gas valve, and a mechanical coupler attachable between the junction box and some other feature of the gas valve to physically attach the junction box to the gas valve;

introducing one or more wires through an opening of the junction box; and coupling the one or more wires to a electrical terminal strip disposed within the junction box, wherein the electrical terminal strip is electrically connected to the quick disconnect electrical connector of the junction box, and wherein coupling the one or more wires causes the gas valve to be coupled to a control system.

11. The method of claim 10, further comprising:

introducing a second set of wires into the opening of the junction box, wherein the second set of wires are part of a circuit that is isolated from the gas valve;

coupling the second set of wires via spare terminals of the electrical terminal strip, wherein the spare terminals are electrically separate from the quick-disconnect electrical connector.

12. The method of claim 10, wherein mechanically coupling the junction box to the gas valve comprises coupling the junction box to the gas valve via a tool-less mechanical connector.

13. The method of claim 10, further comprising, before coupling the quick-disconnect connector with the connector on the surface of the gas valve, removing a wire harness from the connector on the surface of the gas valve, and wherein coupling the one or more wires to the electrical terminal strip comprises forming a wiring circuit that replaces the wiring harness.

14. A gas valve assembly, comprising, a gas valve comprising:

an externally mounted first quick-disconnect electrical connector; and a first mechanical coupling feature comprising at least one of the mounting hole, the first quick-disconnect electrical connector, and some other feature of the gas valve; and a junction box comprising:

an enclosure having a second mechanical coupling feature arranged to attach to the first mechanical coupling feature of the gas valve, wherein the second mechanical coupling feature comprises at least one of a mechanical fastener attachable to the mounting hole, a second quick-disconnect electrical connector of the junction box that is attachable with the first quick-disconnect electrical connector of the valve, and a mechanical coupler attachable with the some other feature of the gas valve to physically attach the junction box to the gas valve, wherein the second quick-disconnect electrical connector is disposed on an external surface of the enclosure so that the second quick-disconnect electrical connector is electrically coupled to the first quick-disconnect electrical connector of the gas valve when the first and second coupling features are attached;

an electrical terminal strip disposed within the enclosure; and a current carrying element that electrically couples the electrical terminal strip with the electrical connector, wherein the enclosure includes an opening that facilitates access to at least the electrical terminal strip, and wherein the enclosure includes one or more voids disposed to allow electrical wires to enter the enclosure.

15. The gas valve assembly of claim 14, wherein the electrical terminal strip comprises a plurality of screw terminals.

16. The gas valve assembly of claim 14, further comprising one or more conduit fittings disposed on the one more access voids.

17. The gas valve assembly of claim 14, wherein the current carrying element comprises a circuit board.

18. The gas valve assembly of claim 17, wherein the circuit board comprises electronic circuitry configured to operate with the gas valve.

19. The gas valve assembly of claim 14, wherein the terminal strip includes one or more spare terminals that are electrically separate from the gas valve quick-disconnect electrical connector.

20. The gas valve assembly of claim 14, wherein the one or more mechanical coupling features of the gas valve assembly and the one or more mating features of the gas valve comprise a tool-less mechanical connection.

* * * * *